United States Patent
Standing et al.

(10) Patent No.: US 10,192,846 B2
(45) Date of Patent: Jan. 29, 2019

(54) METHOD OF INSERTING AN ELECTRONIC COMPONENT INTO A SLOT IN A CIRCUIT BOARD

(71) Applicant: Infineon Technologies Austria AG, Villach (AT)

(72) Inventors: Martin Standing, Velden (AT); Marcus Pawley, Kelsall (GB); Andrew Roberts, Denbigh (GB); Robert Clarke, East Peckham (GB)

(73) Assignee: Infineon Technologies Austria AG, Villach (AT)

( * ) Notice: Subject to any disclaimer, the term of this patent is extended or adjusted under 35 U.S.C. 154(b) by 47 days.

(21) Appl. No.: 14/533,597

(22) Filed: Nov. 5, 2014

(65) Prior Publication Data

US 2016/0128198 A1 May 5, 2016

(51) Int. Cl.
| | |
|---|---|
| *H05K 3/30* | (2006.01) |
| *H01L 23/00* | (2006.01) |
| *H01L 23/31* | (2006.01) |
| *H05K 1/14* | (2006.01) |
| *H05K 1/11* | (2006.01) |
| *H05K 3/46* | (2006.01) |

(52) U.S. Cl.
CPC .......... *H01L 24/72* (2013.01); *H01L 23/3107* (2013.01); *H01L 24/09* (2013.01); *H05K 1/142* (2013.01); *H01L 2224/06179* (2013.01); *H01L 2924/1304* (2013.01); *H05K 1/117* (2013.01); *H05K 3/4644* (2013.01); *H05K 3/4697* (2013.01); *H05K 2201/0314* (2013.01); *H05K 2201/10393* (2013.01); *H05K 2201/10409* (2013.01); *Y10T 29/4913* (2015.01)

(58) Field of Classification Search
CPC .. G02B 6/3807; G02B 6/3879; G02B 6/3897; H01R 12/716; H01R 12/722; H05K 5/0286; H05K 1/141; Y10T 29/59155; Y10T 29/4913
USPC ........ 29/832, 846, 874, 884; 439/43, 48, 60, 439/65, 637, 701
See application file for complete search history.

(56) References Cited

U.S. PATENT DOCUMENTS

| | | |
|---|---|---|
| 3,340,587 A | 9/1967 | Beyer et al. |
| 4,563,725 A | 1/1986 | Kirby |
| 4,648,008 A | 3/1987 | Neyroud et al. |
| 4,803,545 A | 2/1989 | Birkle et al. |
| 4,858,479 A | 8/1989 | Voss et al. |
| 4,879,434 A | 11/1989 | Assel et al. |
| 4,906,201 A | 3/1990 | Young et al. |

(Continued)

FOREIGN PATENT DOCUMENTS

| | | |
|---|---|---|
| CN | 101976664 A | 2/2011 |
| CN | 102740646 A | 10/2012 |

(Continued)

*Primary Examiner* — Thiem Phan
(74) *Attorney, Agent, or Firm* — Murphy, Bilak & Homiller, PLLC

(57) ABSTRACT

In an embodiment, a method includes inserting an electronic component including a power semiconductor device embedded in a dielectric core layer into a slot in a side face of a circuit board. The inserting the electronic component causes one or more electrically conductive contacts on one or more surfaces of the electronic component to electrically couple with one or more corresponding electrical contacts arranged on one or more surfaces of the slot.

2 Claims, 5 Drawing Sheets

(56) References Cited

U.S. PATENT DOCUMENTS

| | | |
|---|---|---|
| 5,099,550 A | 3/1992 | Beane et al. |
| 5,138,529 A | 8/1992 | Colton et al. |
| 5,164,543 A | 11/1992 | Benson et al. |
| 5,235,492 A | 8/1993 | Humbert et al. |
| 5,237,485 A | 8/1993 | Cognetti De Martiis et al. |
| 5,251,101 A | 10/1993 | Liu |
| 5,344,113 A | 9/1994 | Jurek et al. |
| 5,450,284 A | 9/1995 | Wekell |
| 5,506,612 A | 4/1996 | Ogata et al. |
| 5,557,064 A | 9/1996 | Isern-Flecha et al. |
| 5,594,204 A | 1/1997 | Taylor et al. |
| 5,699,229 A | 12/1997 | Brownell |
| 5,699,954 A | 12/1997 | Bell et al. |
| 5,747,735 A | 5/1998 | Chang et al. |
| 5,796,583 A | 8/1998 | Gale et al. |
| 5,821,762 A | 10/1998 | Hamaguchi et al. |
| 5,847,928 A | 12/1998 | Hinshaw et al. |
| 6,078,500 A | 6/2000 | Beaman et al. |
| 6,111,746 A | 8/2000 | Wahl et al. |
| 6,111,752 A | 8/2000 | Huang et al. |
| 6,171,151 B1 | 1/2001 | Lu et al. |
| 6,321,443 B1 | 11/2001 | Barte et al. |
| 6,362,965 B2 | 3/2002 | Bookhardt et al. |
| 6,381,813 B1 | 5/2002 | Lai |
| 6,408,352 B1 * | 6/2002 | Hosaka ............... G06K 19/077 340/5.3 |
| 6,431,259 B2 | 8/2002 | Hellbrueck et al. |
| 6,465,728 B1 | 10/2002 | McLaughlin et al. |
| 6,523,252 B1 | 2/2003 | Lipponen |
| 6,539,618 B1 | 4/2003 | Lyke et al. |
| 6,587,344 B1 | 7/2003 | Ross |
| 6,841,732 B2 | 1/2005 | Yazaki |
| 6,846,115 B1 | 1/2005 | Shang et al. |
| 6,893,268 B1 * | 5/2005 | Harari ............... G06F 13/4068 361/679.37 |
| 6,945,786 B2 | 9/2005 | Ammar et al. |
| 6,975,518 B2 | 12/2005 | Frutschy et al. |
| 6,977,816 B2 | 12/2005 | Lee et al. |
| 7,012,809 B2 | 3/2006 | Han et al. |
| 7,021,971 B2 * | 4/2006 | Chou ............... G06K 19/07732 439/218 |
| 7,186,925 B2 * | 3/2007 | Tsukahara ............. H05K 3/321 174/259 |
| 7,203,066 B2 | 4/2007 | Lee et al. |
| 7,360,365 B2 | 4/2008 | Codecasa et al. |
| 7,469,457 B2 | 12/2008 | Ishikawa et al. |
| 7,518,873 B2 | 4/2009 | Park et al. |
| 7,537,458 B2 | 5/2009 | Idzik et al. |
| 8,156,644 B2 | 4/2012 | Mankin et al. |
| 8,482,923 B2 | 7/2013 | Tan et al. |
| 2003/0150645 A1 | 8/2003 | Chiu |
| 2003/0189246 A1 | 10/2003 | Iwaki et al. |
| 2004/0099940 A1 | 5/2004 | Standing et al. |
| 2004/0106229 A1 | 6/2004 | Jiang et al. |
| 2004/0111876 A1 | 6/2004 | Cheng et al. |
| 2007/0227761 A1 | 10/2007 | Tuominen et al. |
| 2007/0253179 A1 | 11/2007 | Briggs |
| 2007/0261235 A1 | 11/2007 | Byrd et al. |
| 2008/0006923 A1 | 1/2008 | Otremba |
| 2008/0128909 A1 | 6/2008 | Hann |
| 2008/0251893 A1 | 10/2008 | English et al. |
| 2009/0154109 A1 | 6/2009 | Chen et al. |
| 2011/0026232 A1 | 2/2011 | Lin et al. |
| 2011/0031611 A1 | 2/2011 | Standing |
| 2011/0197438 A1 | 8/2011 | Kikuchii et al. |
| 2011/0247874 A1 | 10/2011 | Watanabe et al. |
| 2011/0303449 A1 | 12/2011 | Kobayashi et al. |
| 2012/0075807 A1 | 3/2012 | Refai-Ahmed et al. |
| 2012/0266459 A1 | 10/2012 | Bessette et al. |
| 2013/0155723 A1 | 6/2013 | Coleman |
| 2013/0242496 A1 | 9/2013 | Ahmad et al. |
| 2013/0343000 A1 | 12/2013 | Shi et al. |
| 2014/0168920 A1 | 2/2014 | Hondo |
| 2015/0028487 A1 | 1/2015 | Meyer-Berg et al. |

FOREIGN PATENT DOCUMENTS

| | | |
|---|---|---|
| CN | 103311193 A | 9/2013 |
| GB | 2163598 A | 2/1986 |
| JP | H04370957 A | 12/1992 |
| JP | 2007035739 A | 2/2007 |
| JP | 2013243345 A | 12/2013 |
| JP | 2014157857 A | 8/2014 |
| KR | 20050050557 A | 5/2005 |

* cited by examiner

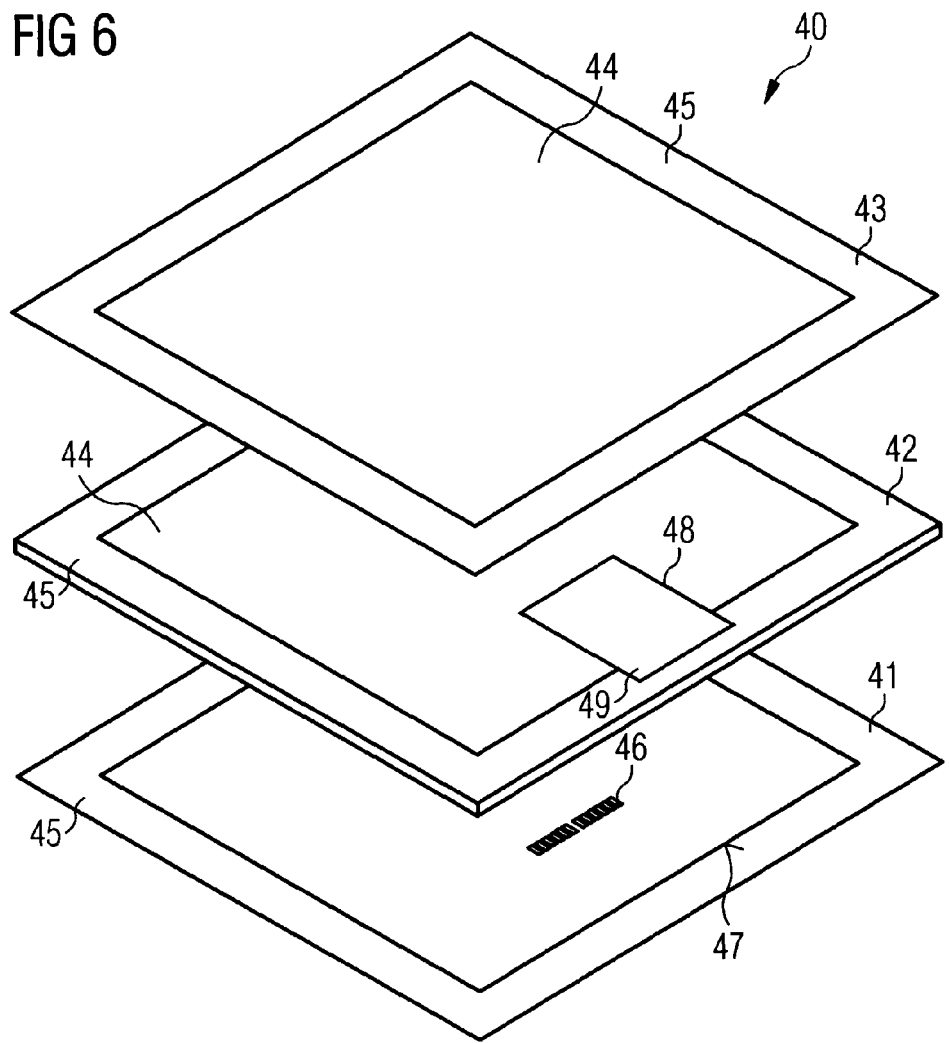

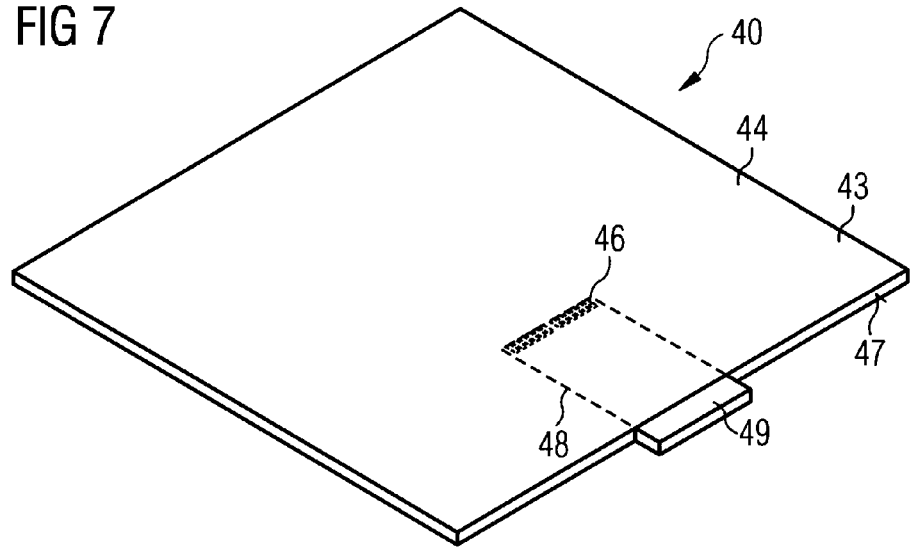
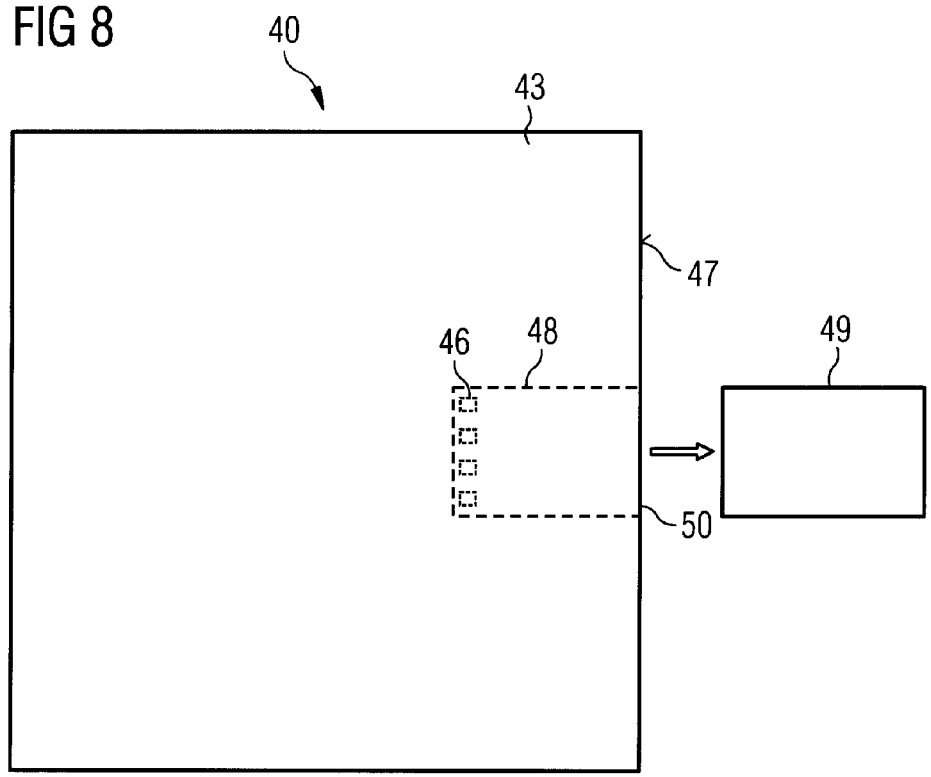

METHOD OF INSERTING AN ELECTRONIC COMPONENT INTO A SLOT IN A CIRCUIT BOARD

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

SUMMARY

In an embodiment, a method includes inserting an electronic component including a power semiconductor device embedded in a dielectric core layer into a slot in a side face of a circuit board. The inserting the electronic component causes one or more electrically conductive contacts on one or more surfaces of the electronic component to electrically couple with one or more corresponding electrical contacts arranged on one or more surfaces of the slot.

In an embodiment, an electronic component includes a power semiconductor device embedded in a dielectric core layer and one or more electrically conductive contacts arranged on one or more surfaces of the electronic component. The electronic component is sized and shaped to be detachably insertable in a slot in a side face of a circuit board and electrically coupleable with one or more corresponding electrical contacts arranged on one or more surfaces of the slot.

In an embodiment, a circuit board includes a slot in a side face, the slot being sized and shaped to accommodate an electronic component comprising a power semiconductor device embedded in a dielectric core layer detachably insertable in the slot, the slot including one or more electrical contacts that are sized, shaped and arranged to couple with one or more corresponding contacts arranged on one or more surfaces of the electronic component when the electronic component is detachably inserted in the slot.

In an embodiment, a method for producing a circuit board includes arranging a second dielectric core layer on a first dielectric core layer including a contact such that the contact is positioned at the base of an aperture in the second dielectric core layer, arranging a plug in the aperture, arranging a third dielectric layer on the second dielectric layer and covering the plug, attaching the first, second and third dielectric layers to one another and producing a circuit board, removing the plug and producing a slot in a side face of the circuit board.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6 illustrates an exploded view of a circuit board.

FIG. 7 illustrates an intermediate stage in the fabrication of a slot in a side face of a circuit board.

FIG. 8 illustrates the formation of a slot in the side face of the circuit board.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
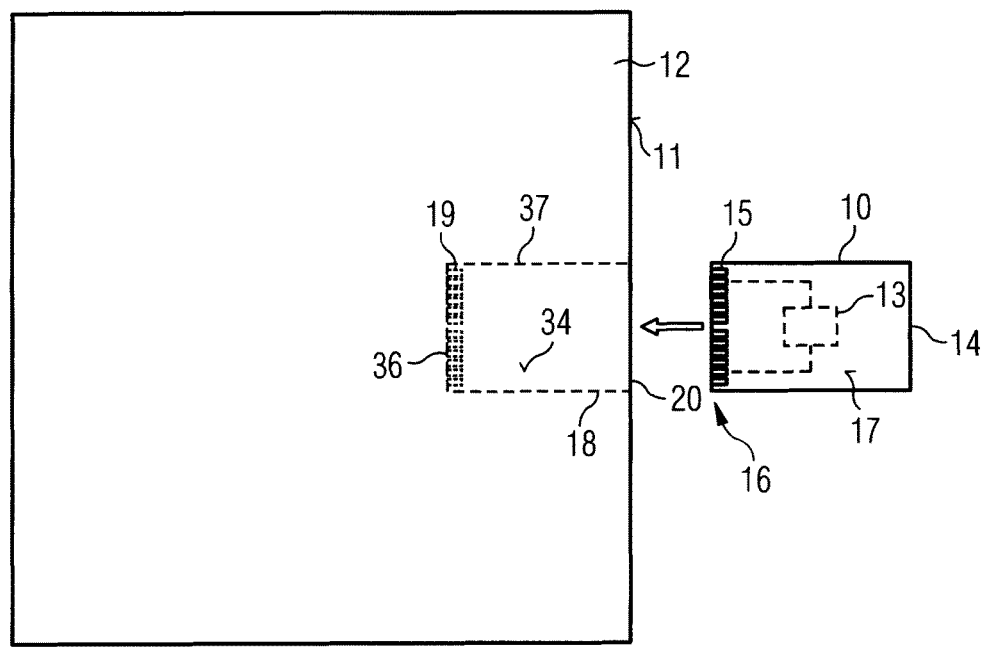
FIG. 1 illustrates the insertion of an electronic component into a slot positioned in a side face of a circuit board.

FIG. 1 illustrates the insertion of an electronic component 10 into a side face 11 of a circuit board 12. The electronic component 10 has a substantially planar rectangular form and includes a power semiconductor device 13 embedded in a dielectric core layer 14 and one or more electrically conductive contacts 15 arranged on one or more surfaces of the electronic component 10. In the embodiment illustrated in FIG. 1, a plurality of electrically conductive contacts 15 is arranged at a first peripheral region 16 of a first major surface 17 of the dielectric core layer 14. The power semiconductor device 13 is electrically coupled to the contacts 15 by a conductive redistribution structure arranged within and/or on the dielectric core layer 14.

Figure 2:
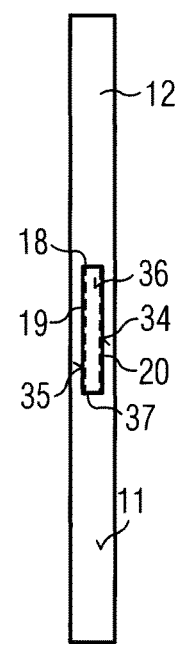
FIG. 2 illustrates the side face of the circuit board including the slot.

As illustrated in the top view of FIG. 1 and the side view of FIG. 2, the circuit board 12 includes a slot 18 in the side face 11. FIG. 2 illustrates the open end 20 of the slot 18 in the side face 11 of the circuit board 12. The slot 18 has a generally rectangular cross-section and is sized and shaped to accommodate the electronic component 10 within its volume.

One or more electrically conductive contacts 19 are arranged on one or more surfaces of the slot 18. In the embodiment illustrated in FIG. 1, the one or more electrically conductive contacts 19 are arranged on a single surface of the slot 18 and are sized, shaped and arranged to correspond to the electrically conductive contacts 15 of the electronic component 10. The electronic component 10 is inserted into the slot 18 in the side face 11 of the circuit board 12 with the first peripheral region 16 leading so that the plurality of electrically conductive contacts 15 is arranged at the base of the slot 18. The electrically conductive contacts 15 are electrically coupled to the contacts 19 to electrically couple the power semiconductor device 13 to the circuit board 12.

The electronic component 10 is sized and shaped to fit within the slot 18 such that when fully inserted in the slot 18, the contacts 15 arranged on the first surface 17 of the electronic component 10 are in physical contact with the contacts 19 of the slot 18. The contacts 15 of the electronic component 10 and the contacts 19 arranged in the slot may be provided by contact pads which are in surface to surface contact when the electronic component 10 is positioned in the slot 18. The contacts 15 may also be electrically coupled to the contacts 19 by purely mechanical contact between the contacts 15 of the electronic component 10 and the contacts 19 of the circuit board 12 when the electronic component 10 is inserted into the slot 18.

The contacts 15 of the electronic component 10 and/or the contacts 19 of the circuit board 12 may be sized and shaped to assist in producing a mechanical electrical contact. For example, the contacts 15 or the contacts 19 may include a resilient material, or the height of the slot 18 with respect to the thickness of the electronic component 10 and thickness of the contacts 15 and/or contacts 19 may be selected such that mechanical pressure is exerted on the contact interface upon insertion of the electronic component 10 in the slot 18.

The electronic component 10 is arranged in the slot 18 and is electrically coupled to the circuit board 12 by a surface to surface mechanical contact. This enables the electronic component 10 to be easily exchanged.

The power semiconductor device 13 may be a power transistor device such as a power MOSFET device or a power IGBT device (Insulated Gate Bipolar Transistor) device. As used herein, a power semiconductor device is used to describe a device which may be configured to provide a power supply to an external load. The power semiconductor device 13 may form part of a circuit for supplying power to an external load, for example. The power semiconductor device 13 may form part of a half-bridge or full-bridge circuit, for example, which may be used in a voltage regulator.

The electronic component 10 is not limited to having a single power semiconductor device 13 is embedded in the dielectric core layer 14, but may include one or more further devices which may or may not be power semiconductor devices. The two or more semiconductor devices may be electrically coupled with one another to provide a circuit or portion of a circuit. For example, the electronic component may include two transistor devices, a transistor device and a diode, or one or more transistor devices and a control chip.

The electronic component 10 including the power semiconductor device 13 is not mounted on one of the major surfaces of the circuit board 12 or in contact holes positioned in one of the major surfaces of the circuit board 12, but is mounted within the volume of the circuit board 12. This saves lateral space since further components, such as passive devices, may be mounted on one or both of the major surfaces.

The electronic component 10 has a substantially planar rectangular form which is substantially defined by the shape of the dielectric core layer 14. The dielectric core layer 14 may include a substantially planar prefabricated board including a material such as glassfibre reinforced matrix, or other material, which is typically used to fabricate circuit boards such as the circuit board 11. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The surface area of the major surfaces of the circuit board 10 is larger than the surface area of the side face or faces in which one or more slots 18 are arranged. The circuit board 12 may have a thickness of about 1.6 mm, the electronic component 10 a thickness of about 0.8 mm and the slot 18 may have a height of about 0.81 mm.

The one or more contacts 15 arranged on the first major surface 17 of the dielectric core layer 14 are arranged at a peripheral region 16 of the dielectric core layer 15 and have a similar size, shape and arrangement to the size, shape and arrangement of the contacts 19 in the slot 18. The contacts 19 may include contact pads arranged on a major surface defining the slot 18 towards the base of the slot 18. Slot 18 may be considered as a blind aperture.

The power semiconductor device 13 may be a vertical device including contact pads on two opposing major surfaces. The contact pads of the power semiconductor device 13 may be electrically coupled to the contacts 15, which are arranged on one or more surfaces of the dielectric core layer 14, by a conductive redistribution structure arranged within and/or on the surface of the dielectric core layer 14.

The two major surfaces 34, 35 of the slot 18 may be defined by two dielectric core layers spaced apart by the height of the slot 18. The base 36 of the slot 18 providing the blind end of the aperture and the side walls 37 of the slot 18 may be provided by a third dielectric core layer arranged between the two dielectric core layers defining the first major surface 34 and second major surface 35 of the slot 18. The contact pads 19 are arranged on the second major surface 35. At least one of the dielectric core layers defining the first major surface 34 or the second major surface 35 of the slot 18 may have a thickness such that pressure on this dielectric core layer causes the height of the slot 18 to decrease and mechanically secure the electronic component 10 within the slot 18. The pressure applied to the dielectric core layer may also produce or improve the mechanical electrical coupling between the electronic component 10 and the circuit board 12.

Figure 3:
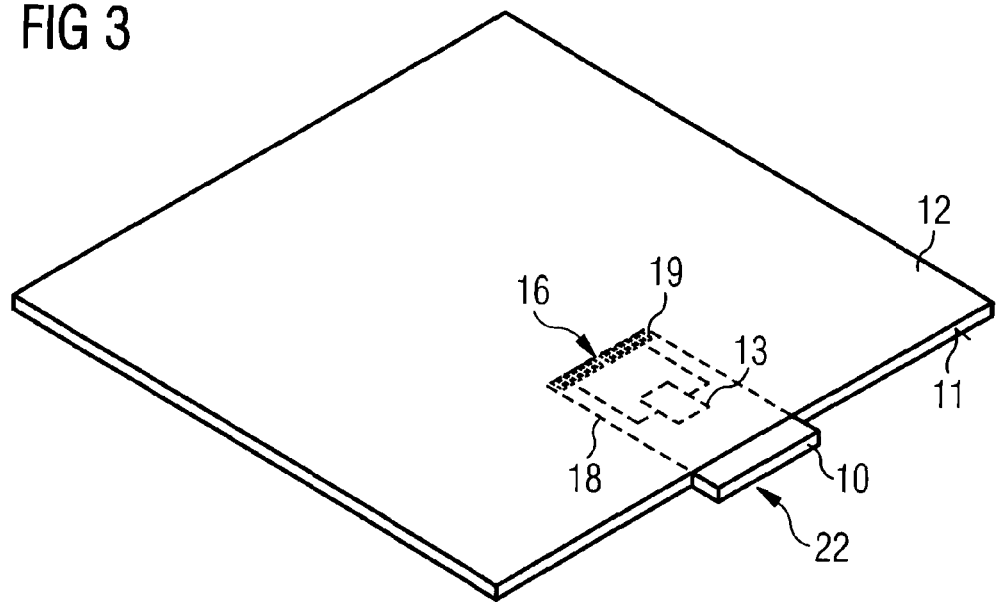
FIG. 3 illustrates the electronic component arranged within the slot in the circuit board.

FIG. 3 illustrates a perspective view of the electronic component 10 positioned within the slot 18 in the circuit board 12. A second peripheral region 22 of the electronic component 10 opposing the first peripheral region 16, in which the contacts 15 are arranged, may protrude from the side face 11 of the circuit board 12 when the electronic component 10 is fully inserted in the slot 18. This protruding region may be used to facilitate the removal of the electronic component 10 from the circuit board 12. In other embodiments, the side face 11 may include an indentation at the open end 20 of the slot in which the second peripheral region 22 of the electronic component is positioned. The second peripheral region 22 positioned in the slot may be grasped to remove the electronic component 10 from the slot 18. In other embodiments, the side face of the second peripheral region 22 is substantially flush with the side face 11 of the circuit board 12. The electronic component 10 may be removed from the circuit board 11 to exchange of the power semiconductor device 13, for example, upon failure of the electronic component 10.

Although a single electronic component 10 arranged in a single slot 18 in the circuit board 12 is illustrated in FIGS. 1 to 3, two or more slots 18 in one or more of the side faces 11 of the circuit board 12 may also be provided and the further slots may be used to accommodate further electronic devices. The size and shape of the slots and electronic components are selected such that the electronic components can be accommodated within the slots. The electronic component may be substantially planar so as to be accommodated in the substantially rectangular slot 18. The circuit board 10 including the electronic component 10 may provide a module including a circuit or portion of a circuit for use with a further circuit board.

The electrical connection between the electronic component 10 and the circuit board 12 may be formed entirely by mechanical pressure between the contacts 15 of the electronic component 10 and the contacts 19 within the slot 18. In some embodiments, the resistance of the electrical connection or the electrical connection itself is produced by use of a pressure exerting fixture which is used to exert pressure on the contacts 19 of the slot 18 and/or the contacts 15 of the electronic component 10. The pressure exerting fixture may also be used to secure the electronic component 10 within the slot 18.

Figure 4:
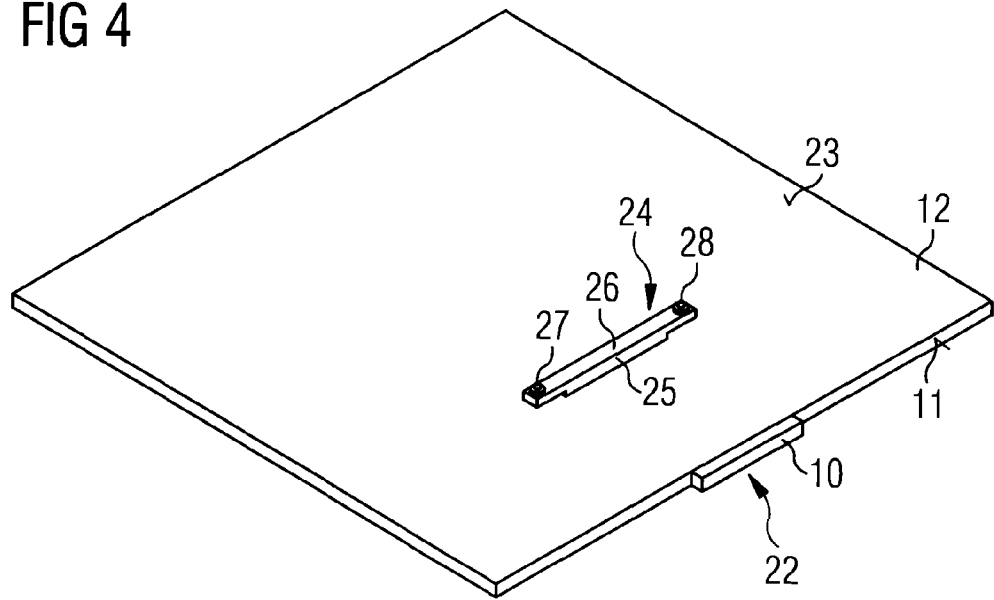
FIG. 4 illustrates a perspective plan view of a pressure exerting fixture electrically coupling the electronic component to the circuit board.
Figure 5:
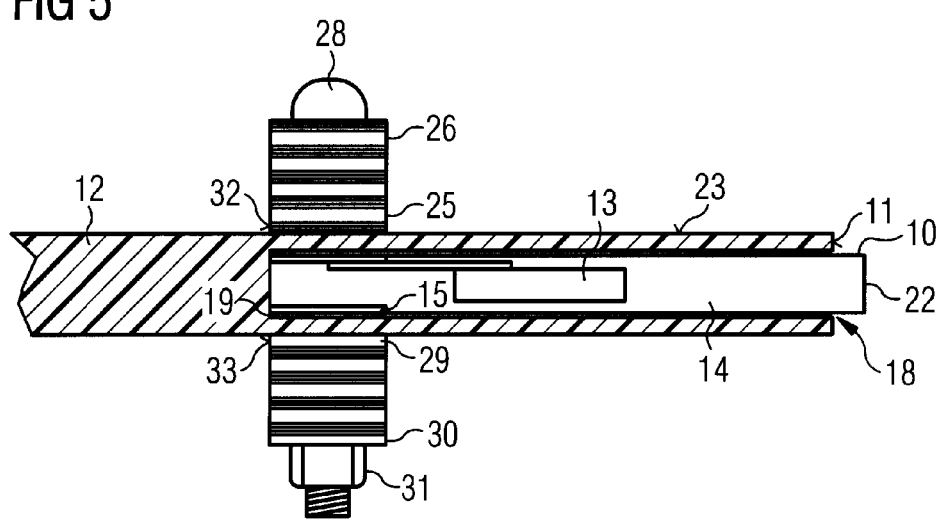
FIG. 5 illustrates a cross-sectional view of the electronic component in the slot.

FIG. 4 illustrates a perspective plan view of a pressure exerting fixture 24 electrically coupling the electronic component 10 to the circuit board 12 and FIG. 5 illustrates a cross-sectional view of the electronic component 10 secured in the slot 18 with the assistance of the pressure exerting fixture 24.

The pressure exerting fixture 24 may be arranged on the first major surface 23 of the circuit board 12 above the contacts 19 arranged within the slot 18. The pressure exerting fixture 24 may exert pressure on the first surface 23 of the circuit board 12 so as to deform the circuit board 12 and bend a portion of the circuit board 12 into the volume of the slot 18. This bent portion of the circuit board may mechanically press the contacts 15 of the electronic component 10 onto the contacts 19 arranged within the slot 18. The pressure exerting fixture 24 may be used to improve the electrical connection or to produce a mechanical electrical connection between the electronic component 10 and the circuit board 12. The pressure exerting fixture 24 may also secure the electronic component 10 in the slot 18.

As can be seen in the perspective plan view of FIG. 4, in this embodiment, the pressure exerting fixture 24 includes a rail 25 which has a size and shape substantially similar to the peripheral region 16 of the electronic component 10 and the region of the slot 18 including the contacts 19. The pressure exerting fixture 24 further includes a clamp 26 which is arranged on the rail 25 and which extends over the ends of the rail 15. The clamp 26 is secured to the circuit board 12 by mechanical fixtures 27, 28 arranged at two opposing peripheral ends of the rail 26 which penetrate into the circuit board 12 adjacent side faces of the slot 18.

As can be seen in the cross-sectional view of FIG. 5, the pressure exerting fixture 24 includes a second portion arranged on the opposing major surface 28 of the circuit board 12 which also includes a clamp 29 and a rail 30 which is substantially aligned with the clamp 25 and rail 26 arranged on the first major surface 23 of the circuit board 12. The mechanical fixtures 27, 28 arranged on the first major surface 23 of the circuit board 12 mate with receiver fixtures 31 arranged on the lower surface 28 of the circuit board 12. The pressure exerting fixture 24 squashes the circuit board 12 in the regions occupied by the contacts 15 of the electronic component 10 and by the contacts 19 of the arranged on the slot 18 in order to mechanically electrically couple the electronic component 10 to the circuit board 12.

To remove the electronic component 10 from the circuit board 12, the pressure may be removed from the pressure exerting fixture 24 and the electronic component 10 extracted from circuit board 12 through the open end 20 of the slot 18.

The surface 32 of the clamp 25 and surface 33 of the clamp 29 of the pressure exerting fixture 24 which are in contact with the circuit board 12 may each include a surface including a radius and have a rounded outer contour. This rounded contour enables the pressure to be concentrated on the area of the contacts 15, 19 and assist in providing a more reliable electrical contact between the contacts 15 of the electronic component 10 and the contacts 19 in the slot 18. The form of the contour may also assist in providing a more homogeneous pressure along the width of the electronic component, for example on each of a plurality of contact pads.

The pressure exerting fixture 24 may differ from the rail and clamp arrangement illustrated in FIGS. 4 and 5 and may include other types of mechanical fixings, for example a rail and spring arrangement.

FIG. 6 illustrates an exploded view of a circuit board 40 which includes three layers 41, 42, 43. FIG. 6 illustrates a single circuit board in which each layer 41, 42, 43 includes a central region 44, which provides the finished circuit board and which is surrounded by a peripheral waste portion 45. The peripheral waste portion 45 may be used during manufacturing to ease handling. The layers 41, 42, 43 include a dielectric core material which may be uncured or partially cured. One or more of the upper and lower dielectric layers 41, 43 includes one or more contact pads 46 which are to be positioned on one or more surfaces of a slot positioned in a side face 47 of the circuit board 40. The centre layer 42 includes an aperture 48 which is sized and shaped to accommodate a substantially planar electronic component. The aperture 48 is filled by a plug 49. The plug 49 includes a material which enables the plug 49 to be easily removed from the aperture 48. For example, the plug may include a material which does not easily bond with other materials or with the further materials of the dielectric core layer.

The layers 41, 42, 43 are assembled such that the aperture 48 and the plug 49 are arranged over the contact pads 46 and such that the upper layer 43 and lower layer 41 are arranged on the plug 49. The three layers 41, 42, 43 are joined together to form a multilayer laminate structure. The peripheral waste region 45 and the plug 49 are removed to produce a slot 50 in the side face 47 of the circuit board 40 in which the lower layer 41 and the upper layer 43 define the major surfaces of the slot 50 and the centre layer 42 defines the sidewalls of the slot. The aperture 48 and plug 49 are positioned such that the contact pads 46 are exposed within the slot.

In some embodiments, the aperture 48 and the plug 49 extend into the peripheral waste region 45. After the layers 41, 42, 43 have been joined together, the peripheral waste region 45 may be removed leaving the plug 49 protruding from the side face 47 of the circuit board 40, as illustrated in FIG. 7. The protruding region may be grasped to remove the plug 49 from the circuit board 40, as illustrated in FIG. 8.

The circuit board 40 may include two or more slots in the same or a different side face. The further slot or slots may have the same size or a different size to the slot 50.

The circuit board 40 may include more than three layers. The slot may have the thickness of a single dielectric core layer or two or more dielectric core layers. One or more of the dielectric core layers may include a conductive layer such as a copper foil which may be laminated onto the dielectric core layer.

During the lay-up process of producing a PCB, a section is cut out of a core or pre-preg, which is similar to the form of the required cavity. The material may be removed from the core or pre-preg using a method such as routing, milling, punching laser ablation etc. This section of the core or pre-preg is then replaced with the plug 49. The plug 49 may include a piece of material which is difficult to bond: PTFE, or coated in PTFE a wax type substance that can be liquefied by heating or dissolving in a solvent, for example. When the laminate bonding and required post processing are complete, the plug is removed and a slot or aperture 50 is created in the side face 47 of the circuit board 40.

The cavity has connectors on one or more of the internal faces of the dielectric core layers for electrically coupling to an electronic component inserted in the cavity. A copper foil may be attached to one or both of the surfaces of the dielectric core layers and structured to produce a redistribution structure and the contacts 46. The internal faces of the two opposing outer laminates may be pre-processed to form the redistribution structure. The copper tracks can be etched on only the inner or both the inner and outer surfaces. Surfaces of the mechanical contact areas which face inward are treated, for example by apply in a nickel-gold surface. The remainder of the surface can be treated in a similar manner to a PCB bond layer and may be treated with a roughening etch of other adhesion promoting coating or treatment method. To prevent the contact areas becoming contaminated during the bonding processes, the surface of the contacts can be treated with a material to reduce the risk of excessive resin adhering to the contacts, for example pre-preg materials with limited flow characteristics such as low-flow or no-flow pre-preg materials. In cases where some excess resin adheres to surfaces where it is not required, this can be cleaned by conventional clean-up processing using ultrasonic cleans, plasma washout or de-smearing chemical processes on the singulated PCB, for example.

One method to simplify plug removal is to extend the plug into the waste border of the PCB panel. When routing the PCB at the final stages, the plug may not be cleanly cut through so that enough material remains or that a stub or beak remains to allow the plug to be gripped with a removal tool.

The electronic component may have terminals such as contact pads on one or more edges and one or more sides. In the illustrated embodiment, the terminals are arranged on top and bottom surfaces at one edge of the electronic component, this being the leading edge when inserted into the cavity. The electronic component, when inserted into the cavity, is retained by a rail/clamp, which applies pressure across the termination areas of the electronic component. Shallow radii and elastomeric materials on the clamp faces may be used to improve the pressure distribution to help to facilitate good contacts. The top and bottom "skins" of the cavity benefit from being relatively flexible and so thin materials and the addition of slots or holes at the ends of the span may be used to allow unrestricted distortion of the "skin" in the contact area. Another method may be to use spring clips which extend over the side face of the circuit board and electronic component.

The semiconductor die or dice are embedded in an ultra-thin laminated structure with at least one connection layer from the dice is redistributed outside the areas of the die. The relative nodes may be electrically coupled to external components and circuits with simple through-hole via technologies. Such a package for secondary embedding avoids handling and embedding bare chips.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   inserting an electronic component comprising a power semiconductor device embedded in a dielectric core layer into a slot in a side face of a circuit board, wherein the inserting the electronic component causes one or more electrically conductive contacts on one or more surfaces of the electronic component to electrically couple with one or more corresponding electrical contacts arranged on one or more surfaces of the slot, exerting pressure on the contact of the slot to electrically couple the one or more electrical contacts arranged on one or more surfaces of the slot to the one or more electrically conductive contacts of the electronic component, wherein the exerting the pressure comprises exerting pressure on a surface of the circuit board defining the slot by applying one or more fixation elements.

2. The method according to claim 1, wherein the one or more fixation elements comprise one or more fixation elements selected from the group consisting of:

a clamp, a rail and clamp assembly, a spring and clamp assembly and a mechanical fixing.

* * * * *